(12) United States Patent
Sirois

(10) Patent No.: US 9,471,172 B2
(45) Date of Patent: *Oct. 18, 2016

(54) DISPLAY FOR MOBILE DEVICE WITH ABRASION RESISTANT SILOXANE COATING

(71) Applicant: MOTOROLA MOBILITY LLC, Chicago, IL (US)

(72) Inventor: Ernest J. Sirois, Crystal Lake, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/200,408

(22) Filed: Mar. 7, 2014

(65) Prior Publication Data

US 2014/0267952 A1 Sep. 18, 2014

Related U.S. Application Data

(60) Provisional application No. 61/792,685, filed on Mar. 15, 2013.

(51) Int. Cl.

| C09K 19/00 | (2006.01) |
|---|---|
| G06F 3/041 | (2006.01) |
| G02B 1/10 | (2015.01) |
| C23C 14/12 | (2006.01) |
| C23C 16/26 | (2006.01) |
| B05D 7/04 | (2006.01) |

(52) U.S. Cl.
CPC ............. *G06F 3/0416* (2013.01); *C23C 14/12* (2013.01); *C23C 16/26* (2013.01); *G02B 1/105* (2013.01); *G06F 3/041* (2013.01); *B05D 7/04* (2013.01); *Y10T 156/10* (2015.01); *Y10T 428/1064* (2015.01); *Y10T 428/1068* (2015.01); *Y10T 428/24983* (2015.01)

(58) Field of Classification Search
CPC ........ G02B 1/105; G02B 1/115; G02B 1/10; C09D 7/1216; C23C 16/0272; C23C 16/26; C23C 16/27; C23C 16/30; C23C 16/32; Y10T 428/1064; Y10T 428/1068; Y10T 428/24983
USPC ...... 428/1.1, 1.3, 1.32, 1.51, 1.52, 216, 217, 428/408; 156/60

See application file for complete search history.

(56) References Cited

U.S. PATENT DOCUMENTS

| 5,190,807 A | 3/1993 | Kimock et al. |
| 5,718,976 A | 2/1998 | Dorfman et al. |

(Continued)

OTHER PUBLICATIONS

US 9,175,176, 11/2015, Sirois (withdrawn)

(Continued)

*Primary Examiner* — Ruiyun Zhang
(74) *Attorney, Agent, or Firm* — Wolfe-SBMC

(57) ABSTRACT

An abrasion resistant coating (206) is applied to a display (202) of a mobile device (200). In an embodiment, the coating (140) includes a first layer (106B) including siloxane; a second layer (106A) including siloxane, wherein the second layer has opposing sides and a hardness greater than the first layer; and a third layer (104) including an amorphous carbon selected from a diamond-like carbon and a diamond-like nano-composite. The first layer (106B) and third layer (104) are positioned on opposing sides of the second layer (106A). The third layer (104) has a hardness greater than the second layer (106A).

20 Claims, 19 Drawing Sheets

(56) References Cited

U.S. PATENT DOCUMENTS

| | | | |
|---|---|---|---|
| 5,846,649 | A | 12/1998 | Knapp et al. |
| 6,387,519 | B1 | 5/2002 | Anderson et al. |
| 6,610,777 | B1 | 8/2003 | Anderson et al. |
| 6,939,908 | B1 | 9/2005 | Singhal et al. |
| 6,987,144 | B2 | 1/2006 | Anderson et al. |
| 2004/0156983 | A1* | 8/2004 | Moravec et al. ............. 427/162 |
| 2010/0048257 | A1 | 2/2010 | Prest et al. |
| 2011/0098394 | A1 | 4/2011 | Schmeltzer et al. |
| 2012/0164454 | A1 | 6/2012 | Sung |
| 2014/0272355 | A1* | 9/2014 | Sirois ............................ 428/216 |
| 2016/0085370 | A1 | 3/2016 | Sirois |

OTHER PUBLICATIONS

Yehoda, J.E. et al.: "Highly Durable DLC Coatings for Plastic Transparencies and Optics", 2011 Society of Vacuum Coaters 505/856-7188, 54th Annual Technical Conference Proceedings, Chicago, IL Apr. 16-21, 2011, all pages.

Patel, Parimal J. et al.: "Improved Low-Cost Multi-Hit Transparent Armor", U.S. Army Research Laboratory Aberdeen Proving Ground, MD, Unclassified, Nov. 1, 2006, Distribution A: Approved for public release; distributed is unlimited, all pages.

Druffel, Thad et al.: "The role of nanoparticles in visible transparent nanocomposites", Nanophotonic Materials V. Edited by Gaburro, Zeno; Cabrini, Stefano; Talapin, Dmitri. Proceedings of the SPIE, vol. 7030, article id. 70300F, 9 pp. (2008).

Wang, Haitao et al.: "Transparent poly(methyl methacrylate)/silica/zirconia nanocomposites with excellent thermal stabilities", Polymer Degradation and Stability, vol. 87, Issue 2, Feb. 2005, pp. 319-327.

EPO International Search Report and Written Opinion—PCT/US2014/028253—Dated Aug. 20, 2014.

"DiamondShield Coatings", Morgan Technical Ceramic Diamonex—http://www.diamonex.com/products/diamondshield-coatings/, Mar. 1, 2012, 3 pages.

International Search Report and Written Opinion, Application No. PCT/US2014/024343, Aug. 20, 2014, 15 pages.

Non-Final Office Action, U.S. Appl. No. 14/200,381, Apr. 15, 2015, 10 pages.

Notice of Allowance, U.S. Appl. No. 14/200,381, Jun. 29, 2015, 7 pages.

Non-Final Office Action, U.S. Appl. No. 14/200,381, Mar. 14, 2016, 11 pages.

Restriction Requirement, U.S. Appl. No. 14/957,500, Feb. 4, 2016, 7 pages.

Non-Final Office Action, U.S. Appl. No. 14/957,500, Mar. 15, 2016, 8 pages.

Notice of Allowance, U.S. Appl. No. 14/200,381, Jul. 11, 2016, 5 pages.

Notice of Allowance, U.S. Appl. No. 14/957,500, Jul. 11, 2016, 5 pages.

* cited by examiner

DISPLAY FOR MOBILE DEVICE WITH ABRASION RESISTANT SILOXANE COATING

CROSS-REFERENCE TO RELATED APPLICATIONS

This application is related to co-pending application entitled, "SILOXANE COATINGS FOR A DISPLAY LENS assembly for mobile devices," filed on even date and having inventor Ernest Sirois, Ser. No. 61/792,717, herein incorporated by reference in its entirety.

TECHNICAL FIELD

The present disclosure relates in general to lenses for mobile devices, and, in particular, to methods and apparatus for a display lens having a siloxane hard coat surface.

BACKGROUND

Transparent lenses are used to provide structure and protection to displays, such as on mobile phones. Typical lenses include glass lenses and plastic lenses.

Glass lenses, such as Gorilla Glass, available from Corning Incorporated, Dragontail, available from Asahi Glass Co., Ltd., and Xensation, available from SCHOTT North America, Inc., are formed from alumino-silicate glass that is hardened or strengthened by using a potassium or lithium ion bath. These lenses typically exhibit good scratch resistance, but suffer from poor fracture resistance. In addition, glass lenses may have a limited amount of three-dimensional effect imparted to the glass surface by grinding or polishing the lens, but the extent of the effect is limited.

Plastic lens, such as those using polycarbonate (PC) and poly(methyl methacrylate) (PMMA), allow for the lens to be shaped to provide a three dimensional effect, but typically suffer from poor abrasion resistance. To improve abrasion resistance, a hard coating may be applied to the surface of the plastic lens. Exemplary coatings may be purely siloxane, purely organic such as acrylic or epoxy, or they may include a siloxane/organic interpenetrating network (IPN). The hard coating is typically about 8 microns to about 10 microns in thickness, and are available in a range of harnesses. While the typical hard coatings improve the scratch resistance of the plastic lens, the overall scratch resistance is still inferior that that of a glass lens.

More advanced coatings, such as diamond like carbon (DLC) and diamond like nano-composites (DLN) are also available. However, such coatings are typically applied directly to the glass or plastic substrate, or to a thin adhesion promoting layer. When applied in such a matter to a plastic substrate, these very hard coatings will fail prematurely.

DETAILED DESCRIPTION OF EXEMPLARY EMBODIMENTS

Figure 1:
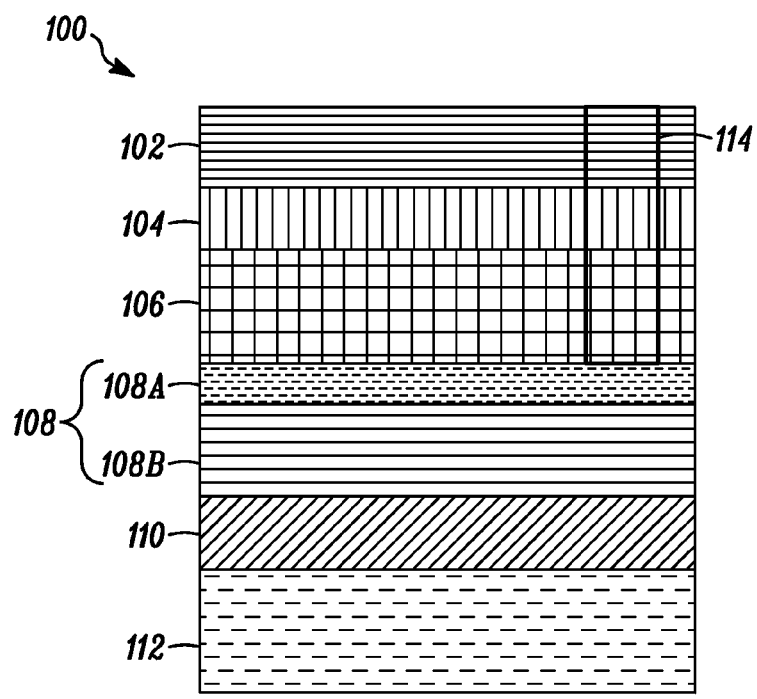
FIG. 1 is an exemplary coated lens assembly including a DLN layer and a siloxane IPN layer bonded to a co-extruded plastic substrate, which in turn is bonded to a transparent lens and assembled to a display/touch assembly.

Briefly, in a specific embodiment, a plastic substrate is protected from abrasion with a coating formed from multiple layers of siloxane and DLN arranged in order of increasing hardness. In one example embodiment, the coated substrate is an abrasion resistant lens for a mobile device.

In one embodiment, a first coating including a siloxane and a second coating including a diamond-like nano-material (DLN) is applied to a plastic substrate. In one example embodiment, a lens for a mobile device is protected using multiple layers of siloxane and DLN arranged in order of increasing hardness.

In one embodiment, an inter-penetrating network (IPN) of siloxane and an organic adhesive is provided between a plastic substrate and a DLN layer. The layer of siloxane and organic adhesive has a hardness intermediate the hardness of the plastic substrate and the DLN layer. In additional embodiments, the layer of siloxane and organic adhesive includes two or more individual layers of inter-penetrating networks of siloxane and an organic adhesive with varying hardness arranged so that the hardness of each layer increases from the layer nearest the substrate to the layer nearest the DLN layer.

In an embodiment, a coating for a substrate is disclosed. The coating includes a siloxane layer including a siloxane-organic interpenetrating network and having a thickness of at least about 20 microns; a diamond-like nano-composite layer including an amorphous carbon and a siloxane, wherein the first layer and third layer are positioned on opposing sides of the second layer, and the third layer has a hardness greater than a hardness of the siloxane layer. In a more particular embodiment, the siloxane layer includes a first siloxane layer contacting the diamond-like nano-composite layer; and a second siloxane layer contacting the first siloxane layer and having a hardness less than a hardness of the first siloxane layer.

In another embodiment, a film is disclosed. the film includes a flexible plastic substrate; a siloxane layer including an siloxane-organic interpenetrating network in contact with the flexible plastic substrate, wherein the first siloxane-organic interpenetrating network layer has a thickness of at least about 20 microns and a hardness greater than a hardness of the flexible plastic substrate; and a diamond-like nano-composite layer including an amorphous carbon and a siloxane in contact with the siloxane layer wherein the diamond-like nano-composite layer has a hardness greater than the hardness of the siloxane layer. In a more particular embodiment, the siloxane layer includes a first siloxane layer contacting the diamond-like nano-composite layer; and a second siloxane layer contacting the first siloxane layer and having a hardness less than a hardness of the first siloxane layer.

In still another embodiment, a display device is disclosed. The display device includes a display and touch screen assembly; a siloxane layer in contact with the display and touch screen assembly, the siloxane layer including a siloxane-organic interpenetrating network in contact with the flexible plastic substrate, wherein the first siloxane-organic interpenetrating network layer has a thickness of at least about 20 microns and a hardness greater than a hardness of the flexible plastic substrate; and a diamond-like nano-composite layer including an amorphous carbon and a siloxane in contact with the siloxane layer wherein the diamond-like nano-composite layer has a hardness greater than the hardness of the siloxane layer. In a more particular embodiment, the siloxane layer includes a first siloxane layer contacting the diamond-like nano-composite layer; and a second siloxane layer contacting the first siloxane layer and having a hardness less than a hardness of the first siloxane layer.

In yet still another embodiment, a method of producing a coating for a substrate is provided. The method includes providing the substrate; applying a siloxane-organic interpenetrating network layer to the substrate, wherein the siloxane-organic interpenetrating network layer has a thickness of from about 20 microns to about 75 microns and a hardness greater than the hardness of the substrate; and applying a diamond-like nano-composite layer including an amorphous carbon and siloxane wherein the diamond-like nano-composite layer has a hardness greater than the hardness of the siloxane-organic interpenetrating network layer. In a more particular embodiment, applying a siloxane-organic interpenetrating network step further includes applying a first siloxane-organic interpenetrating network layer to the substrate; and applying a second siloxane-organic interpenetrating network layer to the first siloxane-organic interpenetrating network layer, wherein the second siloxane-organic interpenetrating network layer has a hardness greater than the hardness of the first siloxane-organic interpenetrating network layer.

Among other advantages, layering a one or more siloxane IPN layers and a DLN layer over a plastic substrate provides for a highly abrasion resistant surface coating. The abrasion resistance has been found to be superior to other plastic lenses and coatings, and was found to be comparable to currently available treated glass lenses. In addition, the construction was found to provide high mar, or dent, resistance. Plastic lenses coated in the siloxane and DLN layers were found to have minimal dents on impact, and were found to provide better protection than other coated plastic lenses.

A plastic substrate coated with the siloxane and DLN layers of the present invention can be used in a traditional two-dimensional lens to achieve comparable scratch and mar resistance to glass, while achieving superior crack and fracture resistance.

Another advantage arises when a plastic substrate coated with siloxane and DLN layers is used in a curved, three-dimensional (3D) rigid shape or a curved flexible shape. The siloxane and DLN layers provide high scratch and mar resistance, while allowing the lens to be formed into three-dimensional shapes including simple and compound bends.

Turning now to the drawings, and as described in detail below, one exemplary of the present disclosed lens coating may be employed. A first exemplary coated lens assembly 100 is illustrated in FIG. 1. Coated lens assembly 100 illustratively includes an anti-finger print layer 102. Anti-finger print layer 102 illustratively provides a hydrophobic treatment to provide for easy cleaning of the surface, while providing a more glass-like feel to the lens. Anti-finger print layer 102 may is illustratively formed from a fluorocarbon material having a siloxane functional group. Exemplary materials include AY 42-258, AY 42-260, 2649 and 2649WP coatings available from Dow Corning, and OPTOOL DSX and DAC coatings available from Daikin Industries. Anti-finger print layer 102 may be applied by high vacuum physical vapor deposition (PVD), spin coating, and spray coating processes.

As illustrated in FIG. 1, directly below anti-finger print layer 102 is DLN layer 104. DLN layer 104 illustratively has a hardness of about Vickers 500. In some embodiments, DLN layer 104 may have Vickers hardness as low as 300, 500, 1000, as great as 1500, 2000, 2500, or greater, or within any range defined between any two of the foregoing values. DLN layer 104 illustratively has a thickness as little as 3 microns, 5 microns, 8 microns, as great as 10 microns, 15 microns, 20 microns, or within any range defined between any two of the foregoing values.

In one embodiment, DLN layer 104 includes a diamond-like nano-composite (DLN). The term DLN includes materials comprised of diamond-like carbon and siloxane. The term diamond-like carbon is meant to include hydrogenated amorphous materials comprised of a mixture of $sp^2$ and $sp^3$ hybridized carbon and hydrogen that are characterized by properties that resemble, but do not duplicate diamond.

Illustratively, DLN layer 104 includes silicon, oxygen, carbon and hydrogen deposited on a substrate by plasma ion beam enhanced chemical vapor deposition. An exemplary DLN is the Diamondshield coating, available from Morgan Technical Ceramics. Methods of making DLN layer 104 known. are provided, for example, in U.S. Pat. No. 5,846, 649, issued Dec. 8, 1998, the disclosures of which are hereby incorporated by reference. In one exemplary method, the surface on which the DLN layer 104 is to be deposited is cleaned to remove contaminates. The surface is then inserted into a vacuum chamber, and the air in the vacuum chamber is evacuated. The surface is then further cleaned and activated by bombarding the surface with energetic ions or exposing the surface to a reactive species. Energetic carbon, silicon, hydrogen, oxygen, and optionally nitrogen ions are then deposited by plasma ion beam deposition using a plasma enhanced chemical vapor deposition (PECVD), vacuum process. Other processes including PECVD without ion beam deposition, inductively coupled plasma, ICP, chemical vapor deposition, and radio frequency plasma enhanced chemical vapor deposition, rf PECVD. All of these and similar processes are capable to deposit transparent hard DLN coatings similar to layer 104.

As illustrated in FIG. 1, directly below DLN layer 104 is siloxane IPN layer 106. In an illustrative embodiment, siloxane IPN layer 106 is formed from an inorganic siloxane (SiOx)-organic adhesive interpenetrating network (IPN). Generally, the greater the siloxane content, the harder the layer formed from the resulting IPN. Conversely, the greater the organic content, the softer the layer formed from the resulting IPN. Exemplary IPN's are the medium hard and special hard siloxane hard coatings available from Meihan Shinku Kogyo Co., Ltd. Although described as interpenetrating networks, in another embodiment, siloxane IPN layer 106 includes siloxane and an organic adhesive, such as acrylic, epoxy, or urethane. Siloxane IPN layer 106 may be applied using dip, spray, or wet spin coating processes.

In one embodiment, siloxane IPN layer 106 may have a thickness as little as 20 microns, 25 microns, 35 microns, as great as 50 microns, 55 microns, 65 microns, 75 microns, or within any range defined between any two of the foregoing values.

Siloxane IPN layer 106 has a Vickers hardness less than that of DLN layer 104. Illustratively, siloxane IPN layer 106 has a hardness of about Vickers 100. In one embodiment, siloxane IPN layer 106 may have a Vickers hardness as low as 20, 50, 100, as great as 150, 200, 300, or within any range defined between any two of the foregoing values. As described in more detail below, siloxane IPN layer 106 may include two or more layers of siloxane, illustratively first and second siloxane IPN layers 106A, 106B (see FIGS. 4-6).

An IPN is chemically prepared by cross-linking an alkoxy silane (Si—O—R) material with an adhesive such as epoxy, acrylic, amine, or urethane. An exemplary silane material is provided as Formula (I)

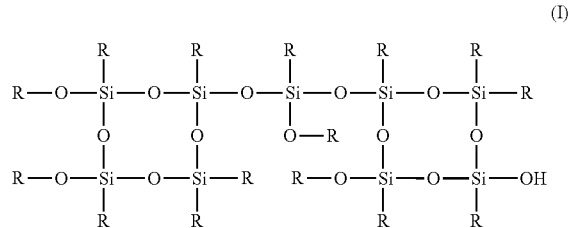

where R is selected from Si, H, methyl, phenyl, other alkyl, or other aryl.

In one exemplary process, the silane is hydrolyzed, followed by condensation of the product, resulting in [—Si—O—Si—O—Si], which is convertible to an amine silane intermediate: $NH_2$—Si—O—Si—$NH_2$. The amine silane intermediate reacts with an epoxy or acrylic organic adhesive to form an interpenetrating network of inorganic siloxane-organic resin.

As illustrated in FIG. 1, below the siloxane IPN layer 106 is a co-extrusion 108 of PMMA, or modified PMMA with improved fracture resistance, and PC. Co-extrusion 108 illustratively includes a PMMA or modified PMMA layer 108A formed of PMMA, or modified PMMA and a PC layer 108B formed of PC. PMMA, or modified PMMA layer 108A is illustratively about 25 to 50 microns in thickness or can range from 10 to 75 microns. The PC layer 108B is illustratively about 100 microns to about 300 microns in thickness or can be up to 400, 500, 600, up to 1200 microns and any thickness within this range. In an exemplary embodiment, co-extrusion provides a flexible film that acts as a substrate onto which the coating layers 114, illustratively the siloxane IPN layer 106, DLN layer 104, and anti-finger print layer 102, can be applied.

As illustrated in FIG. 1, below co-extrusion 108 is rigid lens 110. Rigid lens 110 is illustratively a transparent plastic formed of PMMA, modified PMMA for improved fracture resistance toughness, and/or PC about 500 microns to about 1000 microns in thickness. Rigid lens 110 provides stiffness and support to coated lens assembly 100. Co-extrusion 108 may be bonded to rigid lens 110 using co-molding, thermo-forming, or adhesive bonding processes.

The assembly of the coating layers 114, co-extrusion 108 and rigid lens 110 can then be bonded to or assembled to a touch panel or display assembly 112. Touch panel or display assembly 112 illustratively includes an indium-tin oxide (ITO) capacitive sensor or other transparent conductors such as graphene, carbon nanotube, metal copper or silver nano mesh, a bus assembly, and protective layers, such as formed from polyethylene terephthalate (PET) or other suitable material. Exemplary displays include liquid crystal display (LCD), organic light-emitting diode (OLED), plastic OLED, and e-ink type displays.

In one embodiment, one or more of co-extrusion 108, rigid lens 110, and a touch panel or display assembly 112 further include cosmetic ink (not shown) Cosmetic ink may, for example, be used around an exterior border of coated lens assembly 100 to provide a visual border around the display screen.

In one embodiment, one or more of siloxane IPN layer 106, co-extrusion 108, and rigid lens 110, includes a transparent nano-composite with nano particles of silica, alumina, and/or titanium dioxide. The nano particles illustratively have a diameter of from about 20 nm to about 100 nm. The transparent nano-composite may have nano particles in an amount as little as 1 wt. %, 5 wt. %, 10 wt. %, as great 25 wt. %, 50 wt. %, 60 wt. %, or within any range defined between any two of the foregoing values based on the total weight of the transparent nano-composite. Dispersion solutions containing nano particles of Al2O3 ranging in size from 20 to 800 nanometers include Al-2255, Al-2260, Al2456, Al2425, Al2460, Al-2156, Al2125, Al2160, Al-2350, Al2325, Al2360, Al2850, Al2825, Al2860 available from Nanophase Technology Inc. Dispersion solutions containing nanoparticles of SiO2 ranging from 10 to 100 nm are available from Nissan Chemical, including EG-ST, IPA-ST-L, IPA-ST-UP, IPA-ST-ZL. The transparent nano-composite may further include one or more silane coupling agents. Silane coupling agents have a first moiety that can be made to react with the surface of an oxide particle and a second moiety that can be made to reactive with an organic component of the transparent nano-composite. Exemplary silane coupling agents include Z-6011 (aminopropyltriethoxy silane), z-6020 (aminoethylaminopropyltrimethoxy silane), Z-9094 (aminoethylaminopropyltrimethoxy silane), available from Dow Corning, KBM-3-3 (2-3,4 epoxycyclohexyl ethyltrimethoxy silane), KBM-403 (3-glycidoxypropyltrimethoxy silane), KBE-502 (methoacryloxypropyltrimethoxy silane) available from Shin-Etsu. Organic Transparent hard coatings are available from AzkoNobel N.V. Arkema and others.

Figure 2:
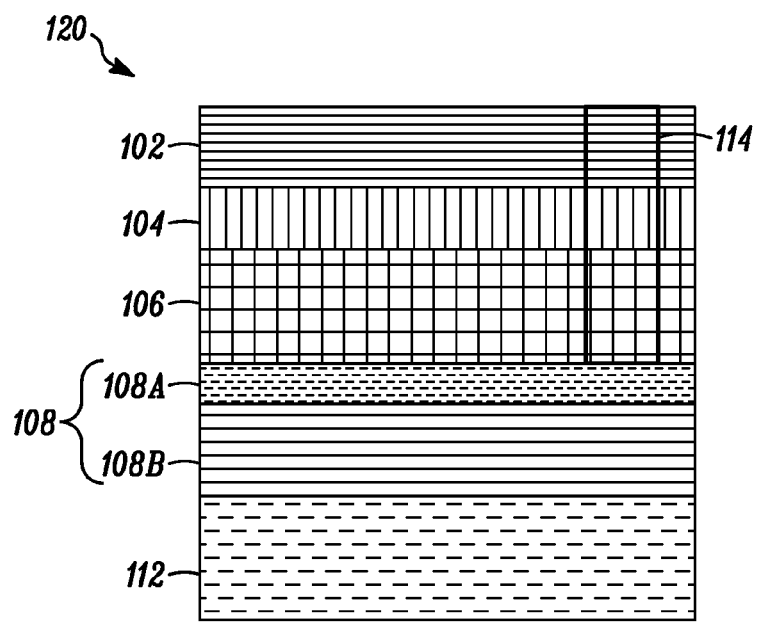
FIG. 2 is an exemplary coated lens assembly including a DLN layer and a siloxane IPN layer bonded to a co-extruded plastic substrate, which in turn is bonded to a display/touch assembly.

A second exemplary coated lens assembly 120 is illustrated in FIG. 2. Coated lens assembly 120 is similar to coated lens assembly 100, but does not include a separate rigid lens 110. The same numerals used to refer to components of coated lens assembly 100 are used to refer to similar components of coated lens assembly 120. Coating layers 114 are applied to a co-extrusion 108 of PMMA 108A and PC 108B. Co-extrusion provides a flexible film that acts as a substrate for the coating layers 114. The co-extrusion 108 and coating layers 114 are then directly bonded to a touch panel or display assembly 112.

Figure 3:
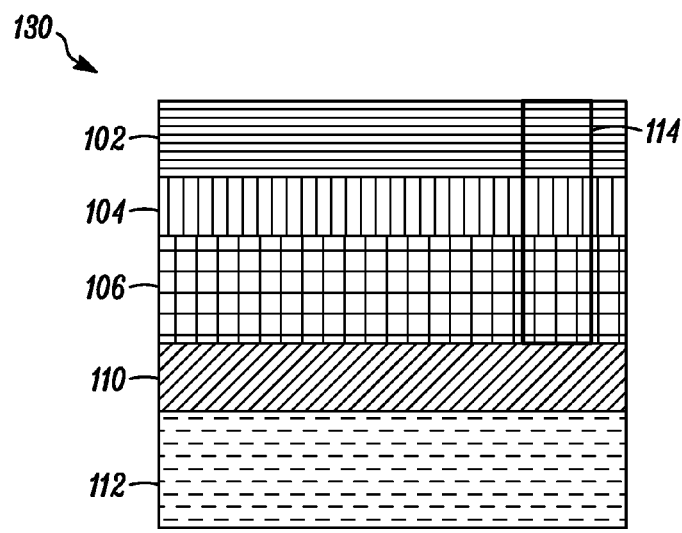
FIG. 3 is an exemplary coated lens assembly including a DLN layer and a siloxane IPN layer bonded to a transparent lens, which is assembled to a display/touch assembly.

A third exemplary coated lens assembly 130 is illustrated in FIG. 3. Coated lens assembly 130 is similar to coated lens assembly 100, but does not include a co-extrusion 108. The same numerals used to refer to components of coated lens assembly 100 are used to refer to similar components of coated lens assembly 130. Coating layers 114 are applied directly to the rigid lens 110. Rigid lens 110 provides a rigid surface that acts as a substrate for the coating layers 114. The rigid lens 110 and coating layers 114 are then directly bonded to a touch panel or display assembly 112.

Figure 4:
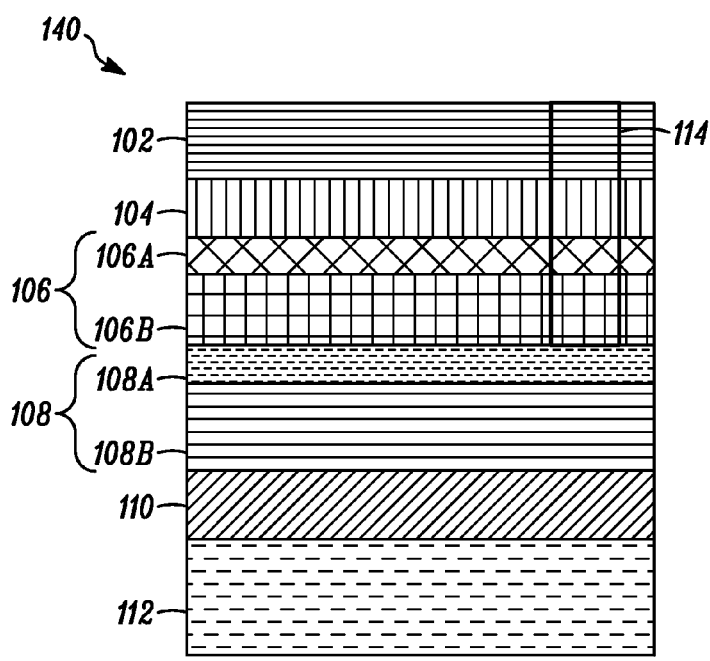
FIG. 4 is an exemplary coated lens assembly including a DLN layer and two siloxane IPN layers bonded to a co-extruded plastic substrate, which in turn is bonded to a transparent lens and assembled to a display/touch assembly.

A fourth exemplary coated lens assembly 140 is illustrated in FIG. 4. Coated lens assembly 140 is similar to coated lens assembly 100, but siloxane IPN layer 106 is shown as a first siloxane IPN layer 106A and a second siloxane IPN layer 106B. The same numerals used to refer to components of coated lens assembly 100 are used to refer to similar components of coated lens assembly 130. Although illustrated as first siloxane IPN layer 106A and second siloxane IPN layer 106B, in other embodiments, siloxane IPN layer 106 may include three, four, five, or more siloxane IPN layers. In one embodiment, each siloxane IPN layer has a hardness intermediate that of the DLN layer 104 and the plastic substrate arranged so that the hardness of each layer increases from the layer nearest the substrate to the layer nearest the DLN layer 104.

First siloxane IPN layer 106A illustratively has a hardness of about Vickers 200. First siloxane IPN layer 106A may have a Vickers hardness as low as 100, 125, 150, as great as 175, 200, 200, 250, or greater, or within any range defined between any two of the foregoing values. First siloxane IPN layer 106A has a thickness as little as 5 microns, 10 microns, as great as 15 microns, 20 microns, 25 microns, or within any range defined between any two of the foregoing values. First siloxane IPN layer 106A may be applied using dip or wet spin coating processes. In an illustrative embodiment, first siloxane IPN layer 106A is formed from an inorganic siloxane (SiOx)-organic adhesive interpenetrating network (IPN) including about 25% siloxane by weight, about 25% to 50% siloxane by weight, or 50% or more siloxane by weight. In one exemplary embodiment, first siloxane IPN layer 106A is pure siloxane layer. An exemplary IPN is the special hard siloxane hard coating available from Meihan Shinku Kogyo Co., Ltd.

Second siloxane IPN layer 106B is softer than first siloxane IPN layer 106A. Second siloxane IPN layer 106B may have a Vickers hardness as low as 20, 25, 50, as great as 75, 100, 150, 200, or within any range defined between any two of the foregoing values. Second siloxane IPN layer 106B has a thickness as little as 10 microns, 20 microns, 25 microns as great as 30 microns, 40 microns, 50 microns, 100 microns, or within any range defined between any two of the foregoing values. Second siloxane IPN layer 106B may be applied using dip or wet spin coating processes. In an illustrative embodiment, second siloxane IPN layer 106B is formed from an inorganic siloxane (SiOx)-organic adhesive interpenetrating network (IPN) including about 10-25% or more siloxane by weight. In one exemplary embodiment, second siloxane IPN layer 106B is a pure acrylic or other suitable organic layer. An exemplary IPN is the special hard siloxane hard coating available from Meihan Shinku Kogyo Co., Ltd. In another illustrative embodiment, second siloxane IPN layer 106B contains essentially no siloxane, but formed from a fully acrylic layer.

Coating layers 114 are applied to a co-extrusion 108 of PMMA 108A and PC 108B. The co-extrusion 108 and coating layers 114 are then bonded, such as by thermo bonding, to the rigid lens 110.

Figure 5:
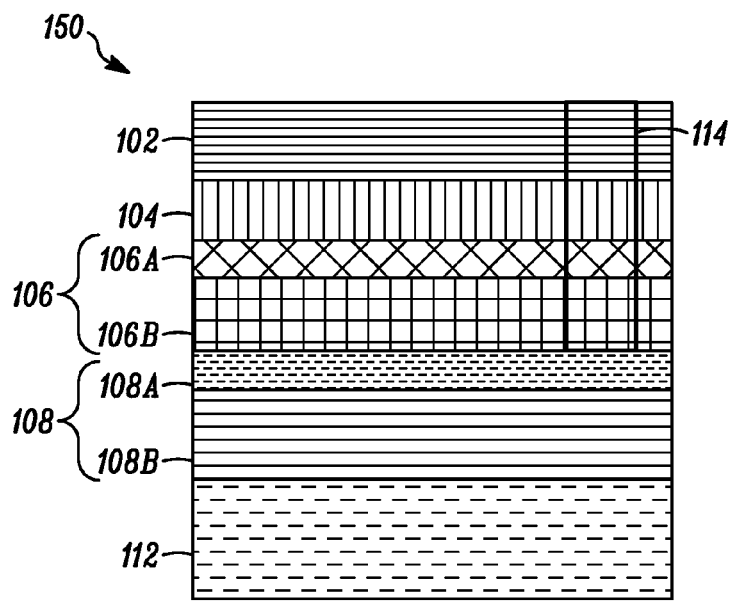
FIG. 5 is an exemplary coated lens assembly including a DLN layer and two siloxane IPN layers bonded to a co-extruded plastic substrate, which in turn is bonded to a display/touch assembly.

A fifth exemplary coated lens assembly 150 is illustrated in FIG. 5. Coated lens assembly 150 is similar to coated lens assembly 140, but does not include a separate rigid lens 110. The same numerals used to refer to components of coated lens assembly 140 are used to refer to similar components of coated lens assembly 150. Coating layers 114 are applied to a co-extrusion 108 of PMMA 108A and PC 108B. The co-extrusion 108 and coating layers 114 are then directly bonded to a touch panel or display assembly 112.

Figure 6:
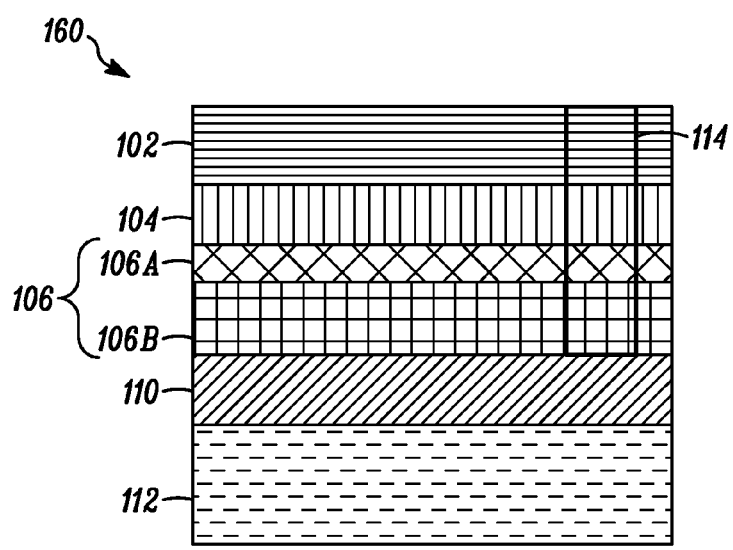
FIG. 6 is an exemplary coated lens assembly including a DLN layer and two siloxane IPN layers bonded to a transparent lens, which is assembled to a display/touch assembly.

A sixth exemplary coated lens assembly 160 is illustrated in FIG. 6. Coated lens assembly 160 is similar to coated lens assembly 140, but does not include a co-extrusion 108. The same numerals used to refer to components of coated lens assembly 140 are used to refer to similar components of coated lens assembly 160. Coating layers 114 are applied directly to the rigid lens 110. The co-extrusion 108 and coating layers 114 are then directly bonded to a touch panel or display assembly 112.

Figure 7:
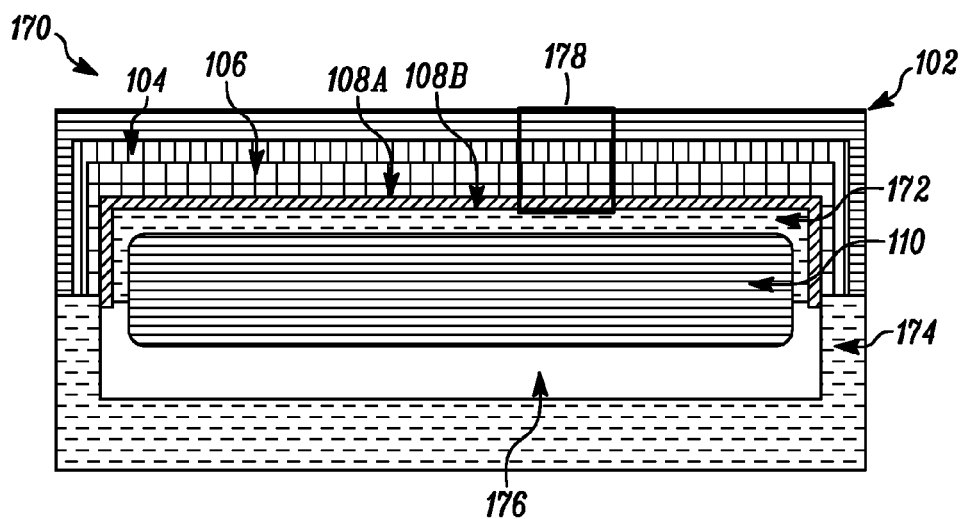
FIG. 7 is an illustrative view of an abrasion resistant lens coating rigidly co-molded to a three dimensional lens and housing.

A seventh exemplary coated lens assembly 170 is illustrated in FIG. 7 positioned with a housing 174. Coated lens assembly 170 is similar to coated lens assembly 100, but rigid lens 110 has been replaced with a 3D rigid lens 172. The same numerals used to refer to components of coated lens assembly 100 are used to refer to similar components of coated lens assembly 170. 3D rigid transparent lens 208 wraps around one or more edges of a touch panel or display assembly 112 to provide a three-dimensional effect. A film 178 including anti-finger print layer 102, DLN layer 104, siloxane IPN layer 106 and co-extrusion 108 is bonded to the housing 174 and 3D rigid lens 172 by wrapping the film around 3D rigid lens 172 and co-molding the film 178 to the 3D rigid lens 172 and housing 174.

Figure 8A:
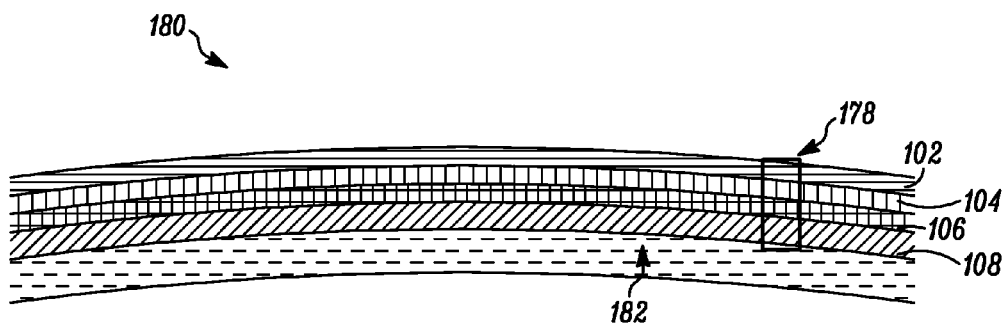
FIGS. 8A and 8B are illustrative views of an abrasion resistant lens coating bonded to a plastic flexible OLED display or e-ink display.
Figure 8B:
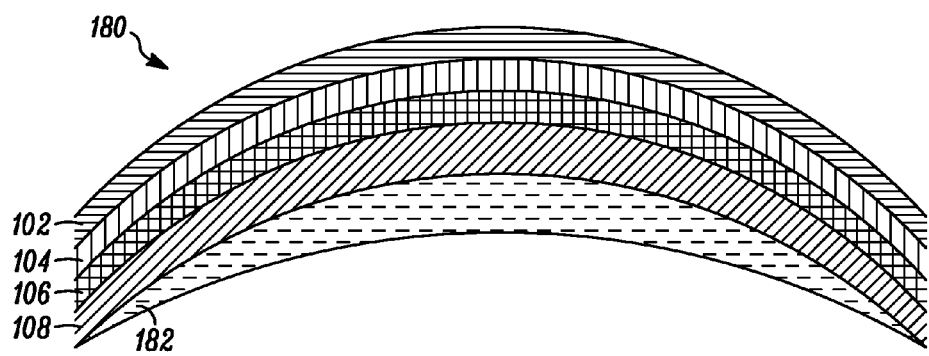

An eighth exemplary coated lens assembly 180 is illustrated in FIGS. 8A and 8B. Coated lens assembly 180 is similar to coated lens assembly 100, but touch panel or display assembly 112 has been replaced with flexible display 182, such as a plastic OLED or e-ink type display and a film 178 including anti-finger print layer 102, DLN layer 104, siloxane IPN layer 106 and co-extrusion 108 is co-extrusion 108 has been directly bonded to flexible display 182. The same numerals used to refer to components of coated lens assembly 100 are used to refer to similar components of coated lens assembly 180. Exemplary flexible displays include plastic flexible OLED and e-ink displays. The lack of a rigid lens allows coated lens assembly 180 to bend and flex from a small deformation from horizontal, as seen in FIG. 8A, to a larger deformation, as seen in FIG. 8B.

Figure 9:
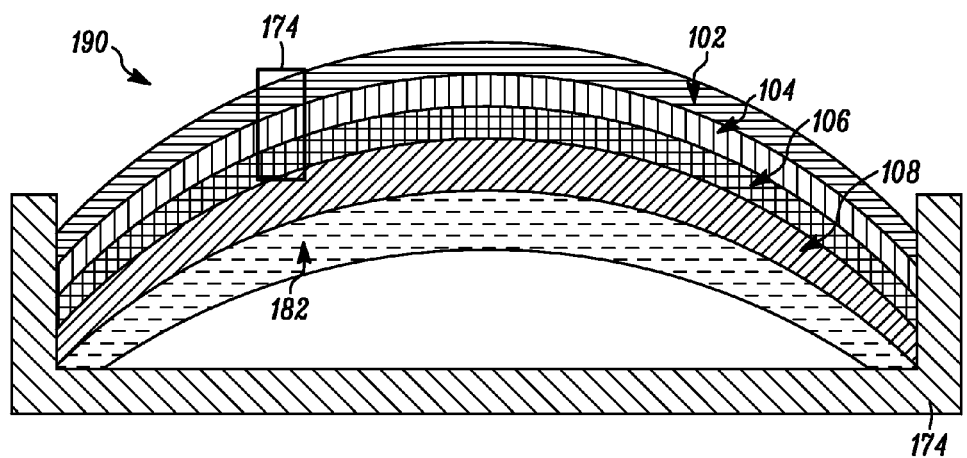
FIG. 9 is an illustrative view of an abrasion resistant lens coating bonded to a flexible three-dimensional substrate, which is bonded to a flexible plastic OLED display or e-ink display, then bonded or assembled to a housing.

A ninth exemplary coated lens assembly 190 is illustrated in FIG. 9. Coated lens assembly 190 is similar to coated lens assembly 180, but further includes a housing 174. The same numerals used to refer to components of coated lens assembly 180 are used to refer to similar components of coated lens assembly 190. A film 178 including anti-finger print layer 102, DLN layer 104, siloxane IPN layer 106 and co-extrusion 108 is co-extrusion 108 has been directly bonded to flexible display 182. The film 178 and flexible display 182 have been bonded or assembled to a housing 174.

The abrasion resistance of various substrates and coatings was investigated using a linear Taber test. Silicon carbide paper (800 grit) was used as an abrasive with a 200 gram mass. Optical properties were measured for each sample initially, at 5 cycles, at 20 cycles, and at 100 cycles. Optical properties were measured using a BYK Gardner spectrophotometer with an integrating sphere to measure percent transmission and percent haze.

The samples tested were (1) untreated polycarbonate, (2) polycarbonate with a 5 micron siloxane hard coat, (3) polycarbonate with a DLN super hard coat, (4) polycarbonate with a 5 micron siloxane hard coat and a DLN super hard coat, (5) polycarbonate with 50 microns PMMA and 20 microns siloxane hard coat, (6) polycarbonate with 50 microns PMMA, 20 microns siloxane hard coat, and a DLN super hard coat, (7), polycarbonate with 50 microns PMMA, 20 microns medium hard siloxane hard coat, and 4 microns special hard siloxane hard coat, (8) polycarbonate with 50 microns PMMA, 20 microns medium hard siloxane hard coat, 4 microns special hard siloxane hard coat, and a DLN super hard coat, (9) potassium ion strengthened alumino-silicate glass (Gorilla Glass), (10) potassium ion strengthened alumino-silicate glass (Gorilla Glass) and a diamond-like carbon (DLC) super hard coat, and (11) potassium ion strengthened alumino-silicate glass (Gorilla Glass) and a DLN super hard coat.

Figure 10A:
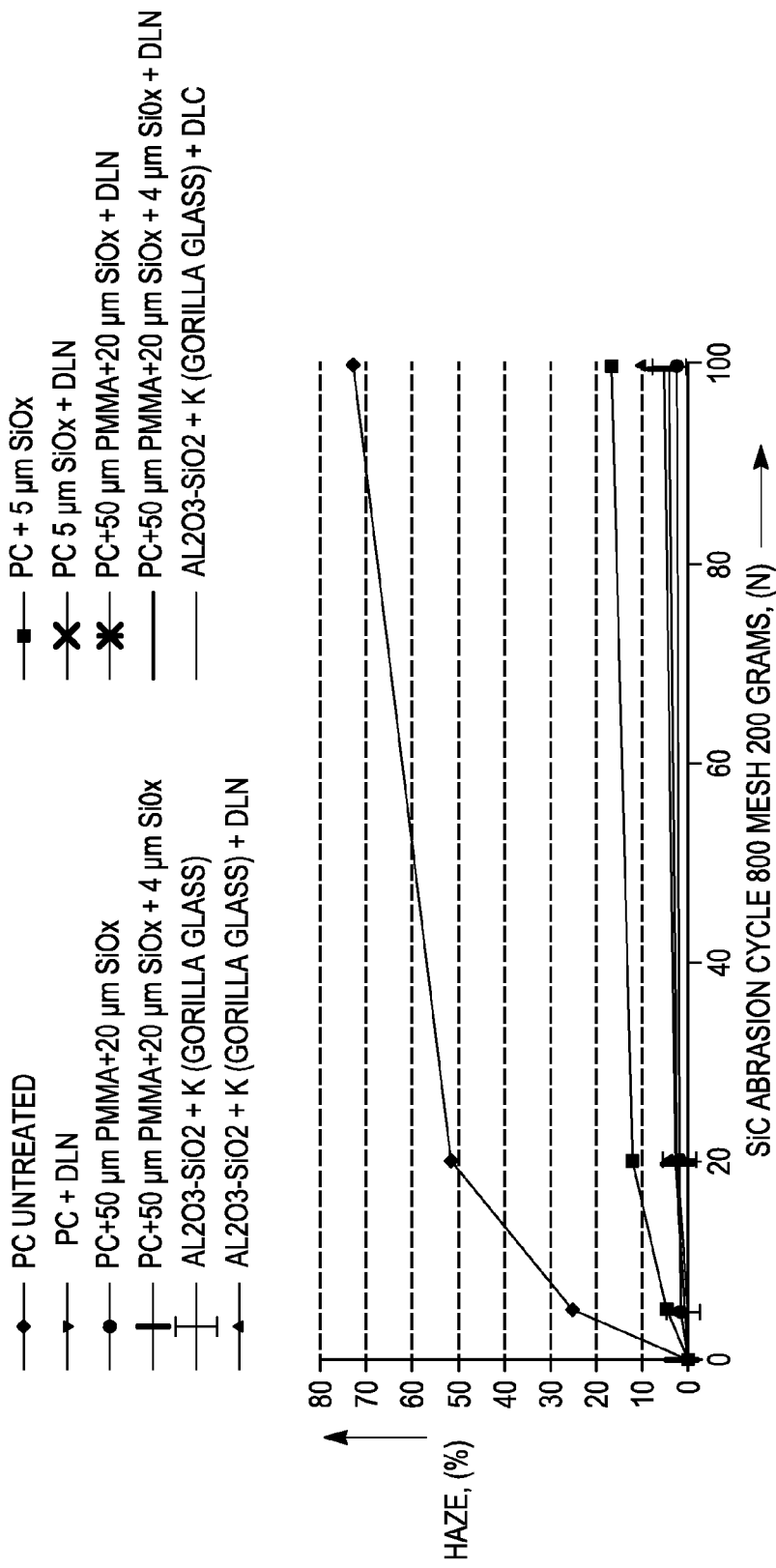
FIG. 10A is a chart showing abrasion resistance as measured by % haze as a function of number cycles of a taber abrasion test for a variety of substrates and coatings.
Figure 10B:
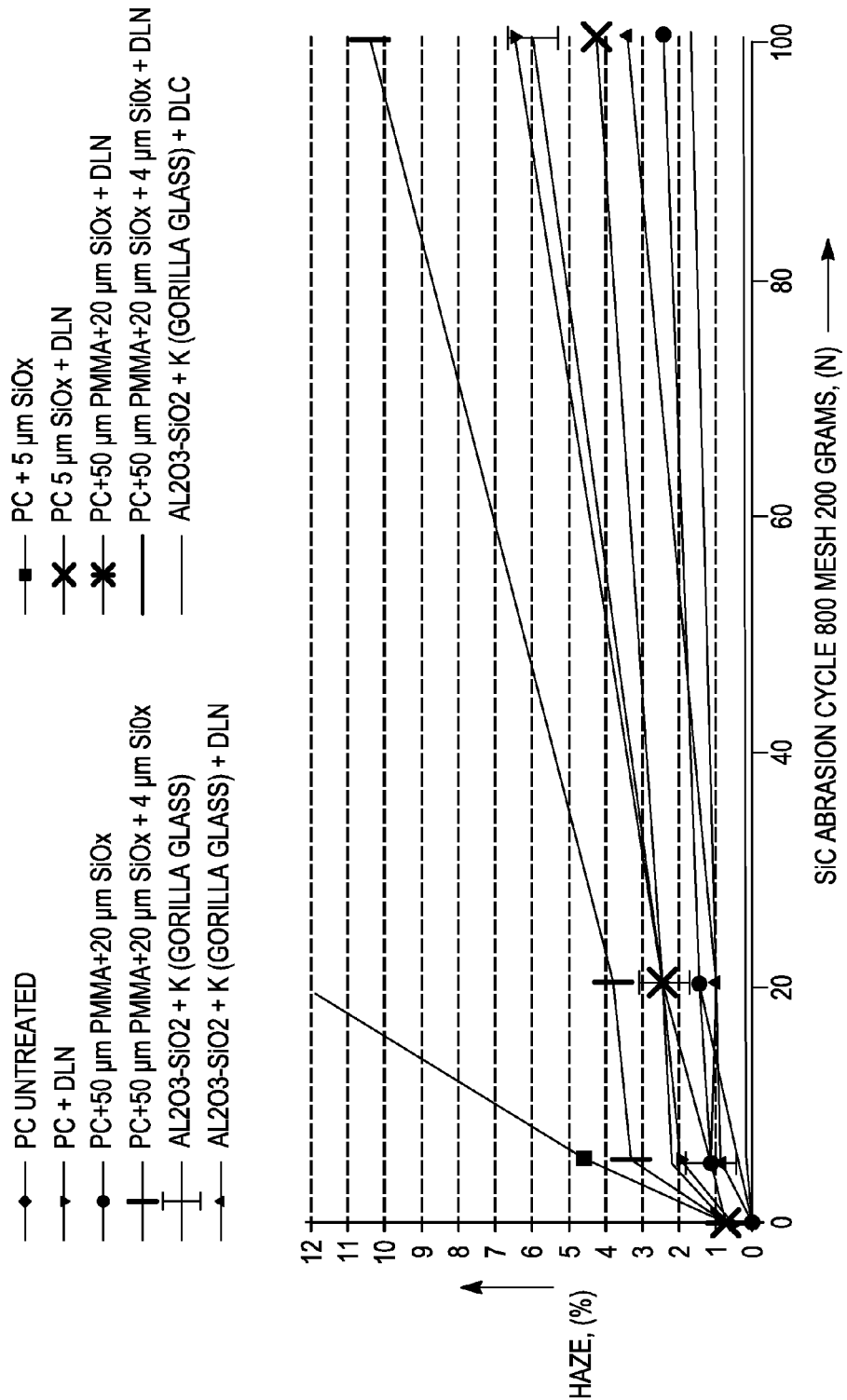
FIG. 10B is a detail of FIG. 10A, showing results of 12% haze or less.
Figure 11A:
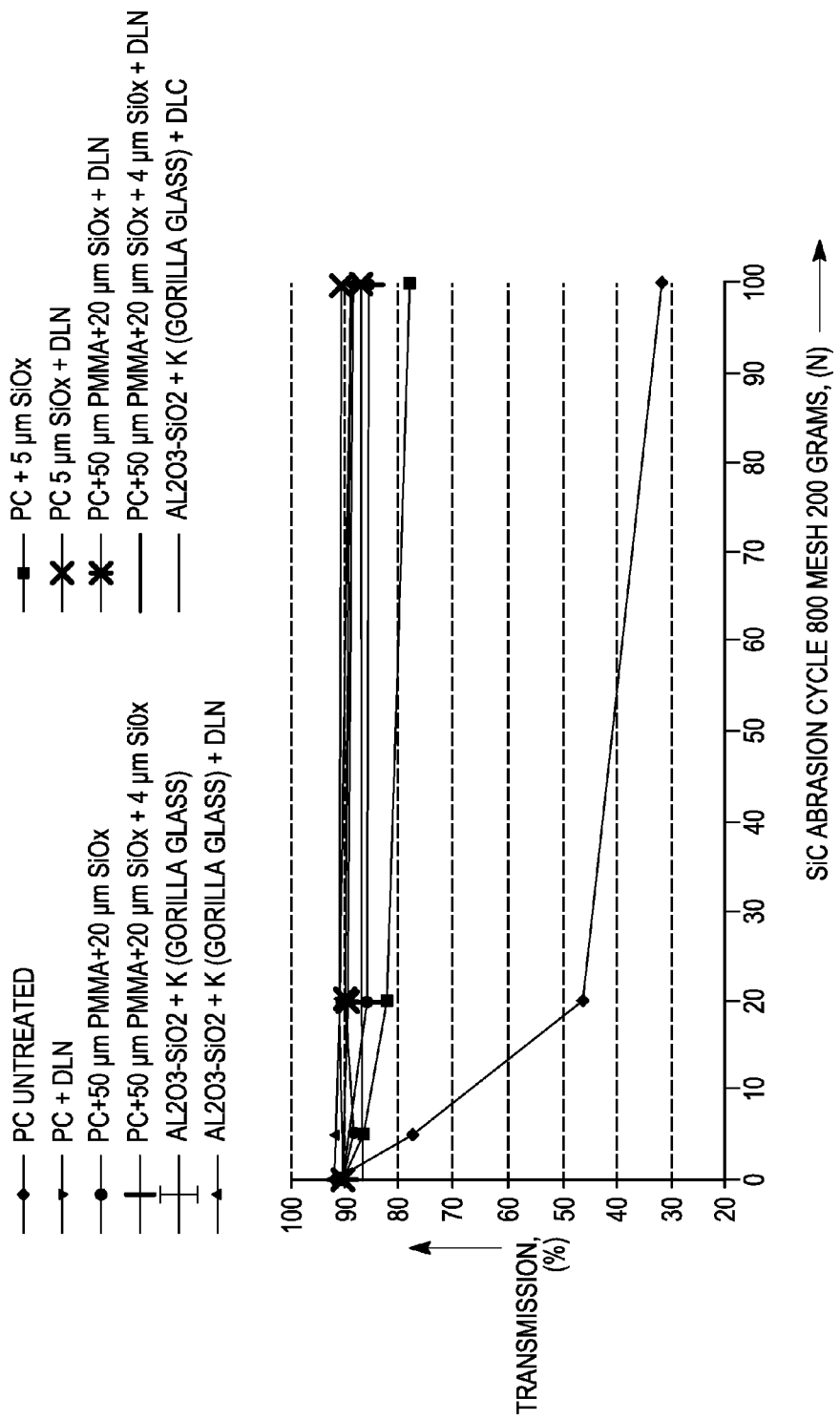
FIG. 11A is a chart showing the abrasion resistance as measured by % transmission as a function of number cycles of a taber abrasion test for a variety of substrates and coatings.
Figure 11B:
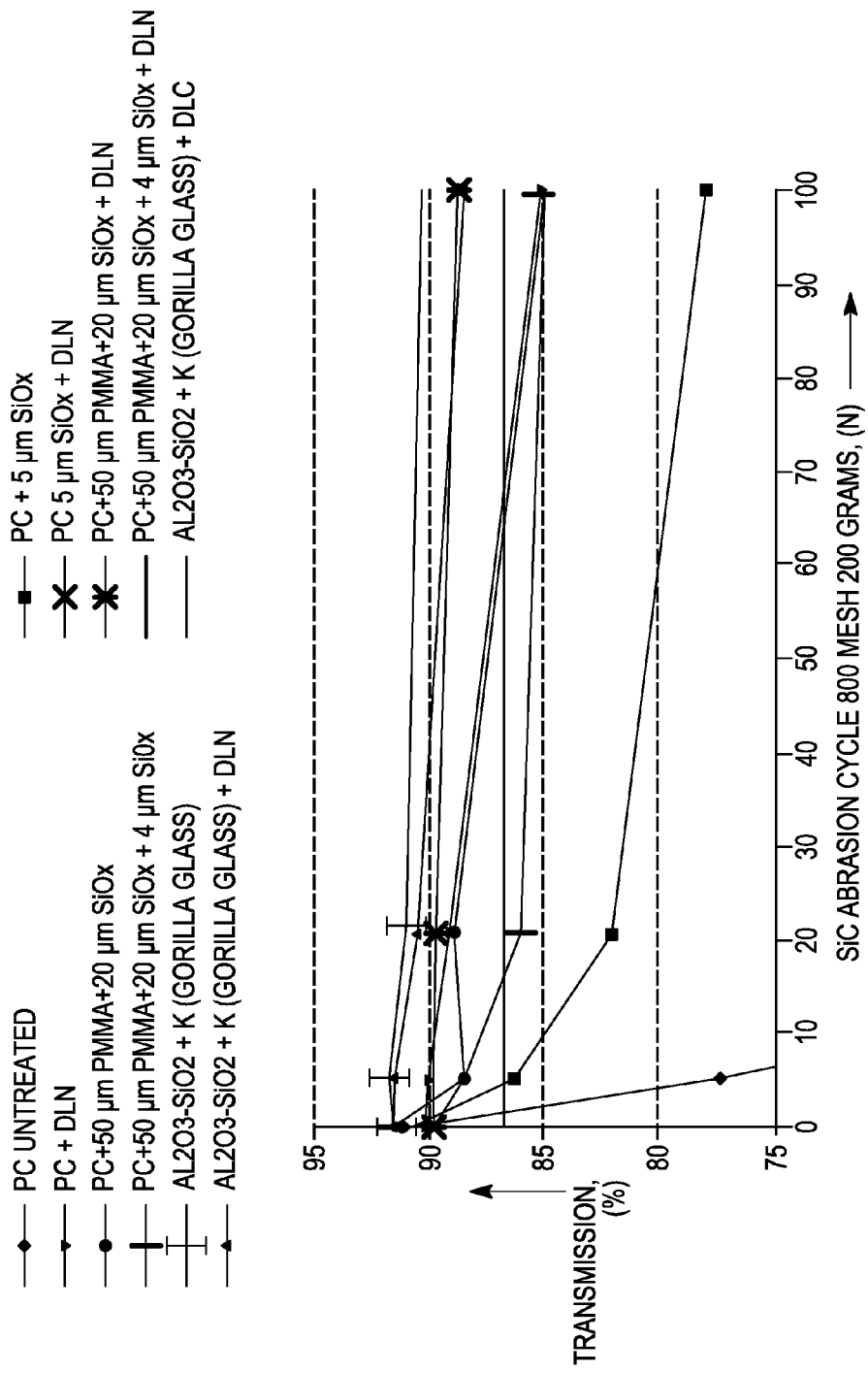
FIG. 11B is a detail of FIG. 11A, showing the results of 75% to 95% transmission.

The results are presented in Tables 1 and 2 below and FIGS. 10 and 11. FIG. 10B is a detail of FIG. 10A, showing results of 12% haze or less. FIG. 11B is a detail of FIG. 11A, showing the results of 75% to 95% transmission.

TABLE 1

Abrasion Resistance - % Haze

| Design | 0 cycles | 5 cycles | 20 cycles | 100 cycles |
|---|---|---|---|---|
| PC untreated | 0.65 | 25.10 | 51.30 | 72.50 |
| PC + 5 um SiOx | 0.55 | 4.60 | 12.50 | 16.50 |
| PC + DLN | 0.60 | 2.10 | 2.50 | 6.60 |
| PC + 5 um SiOx + DLN | 0.92 | 1.10 | 2.40 | 4.30 |
| PC + 50 um PMMA + 20 um SiOx | 0.75 | 3.40 | 3.90 | 10.50 |
| PC + 50 um PMMA + 20 um SiOx + DLN | 0.80 | 1.20 | 1.50 | 2.50 |
| PC + 50 um PMMA + 20 um SiOx + 4 um SiOx | 1.10 | 2.30 | 2.60 | 6.10 |
| PC + 50 um PMMA + 20 um SiOx + 4 um SiOx + DLN | 0.65 | 1.05 | 0.95 | 1.75 |
| Al2O3—SiO2 + K (Gorilla Glass) | 0.11 | .041 | 1.40 | 2.50 |
| Al2O3—SiO2 + K (Gorilla Glass) + DLC | 0.06 | 0.15 | 0.18 | 0.22 |
| Al2O3—SiO2 + K (Gorilla Glass) + DLN | 0.10 | 0.85 | 1.02 | 3.50 |

TABLE 2

Abrasion Resistance - % Transmission

| Design | 0 cycles | 5 cycles | 20 cycles | 100 cycles |
|---|---|---|---|---|
| PC untreated | 91.0 | 77.4 | 46.1 | 31.6 |
| PC + 5 um SiOx | 91.0 | 86.4 | 82.0 | 78.0 |
| PC + DLN | 90.1 | 90.1 | 89.1 | 85.1 |
| PC + 5 um SiOx + DLN | 90.4 | 89.5 | 88.8 | 88.7 |
| PC + 50 um PMMA + 20 um SiOx | 89.6 | 88.5 | 89.0 | 85.1 |
| PC + 50 um PMMA + 20 um SiOx + DLN | 89.9 | 89.9 | 89.7 | 88.6 |
| PC + 50 um PMMA + 20 um SiOx + 4 um SiOx | 91.5 | 88.3 | 86.0 | 85.1 |
| PC + 50 um PMMA + 20 um SiOx + 4 um SiOx + DLN | 91.4 | 90.8 | 91.2 | 90.4 |
| Al2O3—SiO2 + K (Gorilla Glass) | 91.6 | 91.7 | 91.0 | 90.4 |
| Al2O3—SiO2 + K (Gorilla Glass) + DLC | 86.7 | 86.7 | 86.7 | 86.7 |
| Al2O3—SiO2 + K (Gorilla Glass) + DLN | 91.5 | 91.5 | 90.5 | 88.4 |

The abrasion testing results show improved abrasion resistance, as measured by % haze, when the DLN treatment is placed of siloxane hard layer coatings. For example, 20 microns of the medium hard SiOx+4 microns of the special hard SiOx+DLN provided the best abrasion performance of the plastic substrates, including the SiOx layer alone, the DLN layer alone, and the DLN layer over a 5 micron SiOx hard coating.

Compared to potassium ion strengthened alumino-silicate glass, the data show the plastic lens treated with multiple layers of siloxane hard coatings plus DLN have comparable scratch abrasion resistance indicate by haze data. In contrast, the plastic lens with conventional siloxane hard coatings or DLN alone have inferior scratch resistance compared to the glass.

The abrasion testing results show improved abrasion resistance, as measured by % transmission, when the DLN treatment is placed of siloxane hard layer coatings. For example, 20 microns of the medium hard SiOx+4 microns of the special hard SiOx+DLN provided the best abrasion performance of the plastic substrates, including the SiOx layer alone, the DLN layer alone, and the DLN layer over a 5 micron SiOx hard coating.

Compared to potassium ion strengthened alumino-silicate glass, the data show the plastic lens treated with multiple layers of siloxane hard coatings plus DLN have comparable scratch abrasion resistance indicate by transmission data. In contrast, the plastic lens with conventional siloxane hard coatings or DLN alone have inferior scratch resistance compared to the glass.

Dent resistance was investigated using a silicon carbide abrasive drop test. Silicon carbide paper (800 mesh) 50 gram mass was dropped from a height of 25, 10, and 15 cm. The diameter of the dents was measured for each drop. The samples tested were (1) potassium ion strengthened alumino-silicate glass (Gorilla Glass) (labeled GG), (2) potassium ion strengthened alumino-silicate glass (Gorilla Glass) with a DLC hard coating, (labeled GG DLC), and polycarbonate+PMMA+siloxane hard coating, +DLN hard coating (labeled Tprot DLC).

Figure 12:
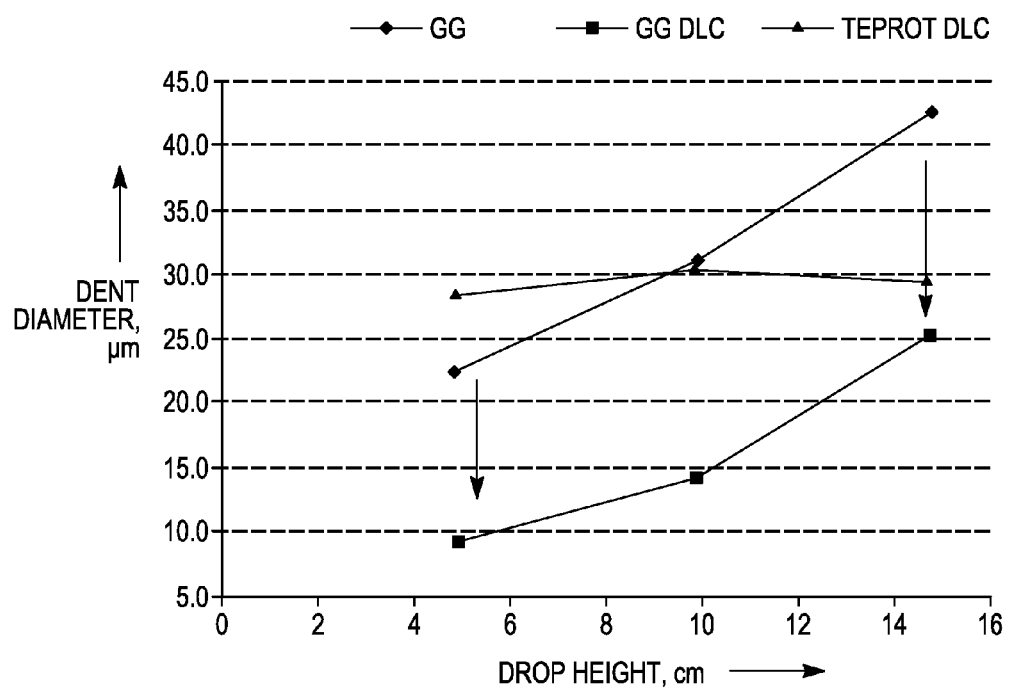
FIG. 12 is a chart showing the dent resistance of glass, treated glass, and treated plastic lenses.

The results are presented in FIG. 12. The data show plastic lens with layered coatings having dents intermediate between the two glass lenses tested.

Figure 13A:
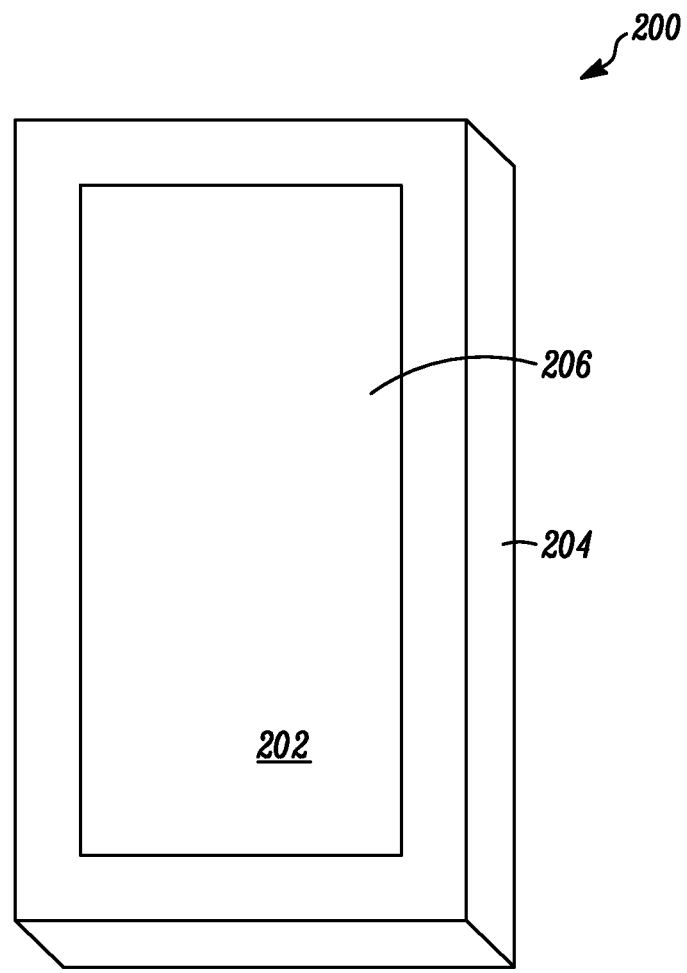
FIG. 13A is a schematic showing a mobile device including an abrasion resistant lens coating.

FIG. 13A is a schematic showing a mobile device 200 having a display 202 and housing 204. Display 202 includes an abrasion resistant coating 206, where abrasion resistant coating 206 includes a DLN layer and a siloxane layer on a plastic substrate.

Figure 13B:
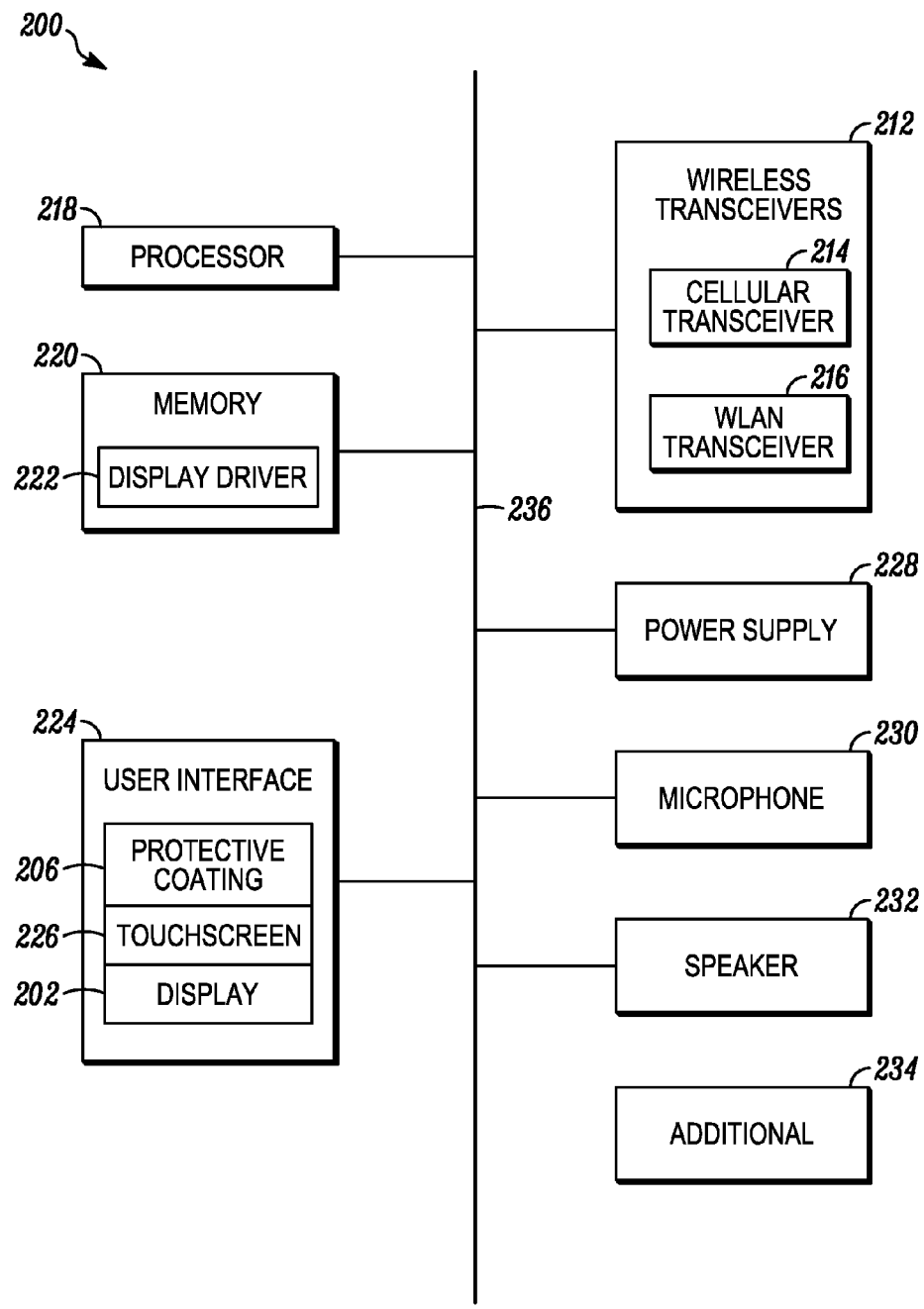
FIG. 13B is a block diagram showing illustrative components of the mobile device of FIG. 13A.

FIG. 13B is a block diagram showing illustrative components of the exemplary mobile device 200 of FIG. 13A. The exemplary mobile device 200 includes wireless transceivers 212 for communication with external networks. In the illustrated embodiment, wireless transceivers 212 include cellular transceivers 214 and a wireless area local network (WLAN) transceiver 216. Mobile device 200 further includes a processor 218, such as a microprocessor, microcomputer, application-specific integrated circuit, etc., having access to a memory portion 220. Memory portion 220 includes a driver 222 for the display 202 of mobile device 200. Mobile device 200 further includes a user interface 224. User interface 224 illustratively includes display 202 and a touch screen 226. As illustrated in FIG. 13B, the touch screen and/or display are protected by a protective coating 206 including a DLN layer and a siloxane layer on a plastic substrate. Mobile device 200 further includes a power supply 228, such as a battery, for providing power to mobile device 200. Mobile device illustratively also includes input devices, such as microphone 230, and output devices, such as speaker 232. Mobile device 200 may also include additional components 234. Exemplary additional components 234 include, but are not limited to, location sensing components, such as a Global Positioning System receiver, a triangulation receiver, an accelerometer, and a gyroscope, a camera, additional inputs, such as flip sensors, keyboards, keypads, touch pads, capacitive sensors, motion sensors, and switches, and other suitable components. Each of the internal components of mobile device 200 can be coupled to one another and in communication with one another by way of one or more internal communication links 236, such as an internal bus.

Figure 14:
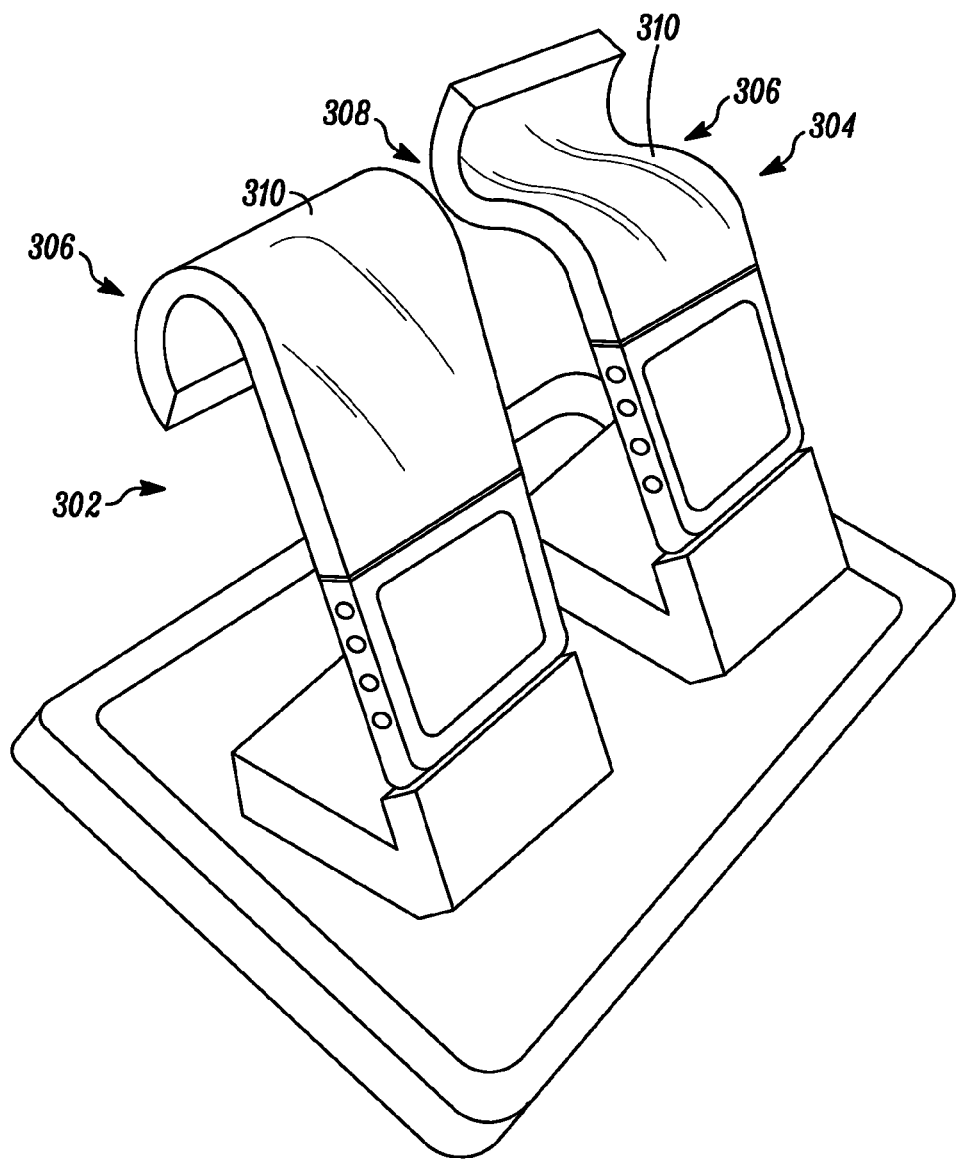
FIG. 14 illustrates exemplary mobile devices having a rigid three-dimensional curved lens having an abrasion resistant coating.
Figure 15A:
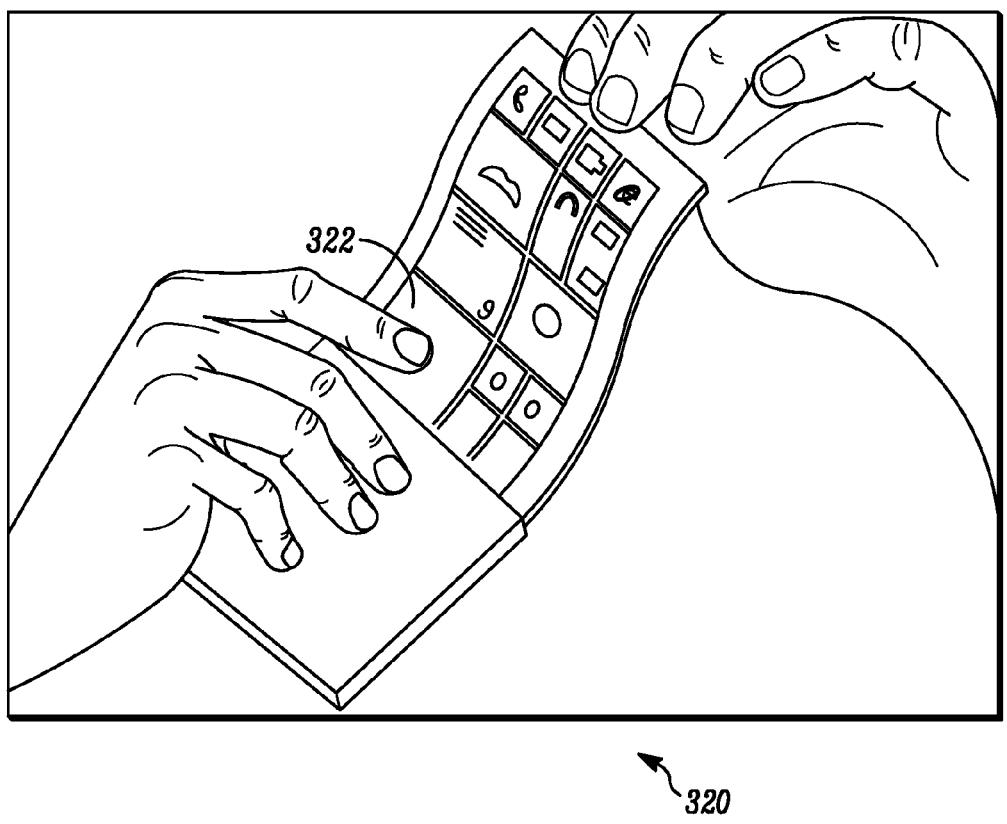
FIG. 15A is an exemplary mobile device having a flexible three dimensional curved lens having an abrasion resistant coating.
Figure 15B:
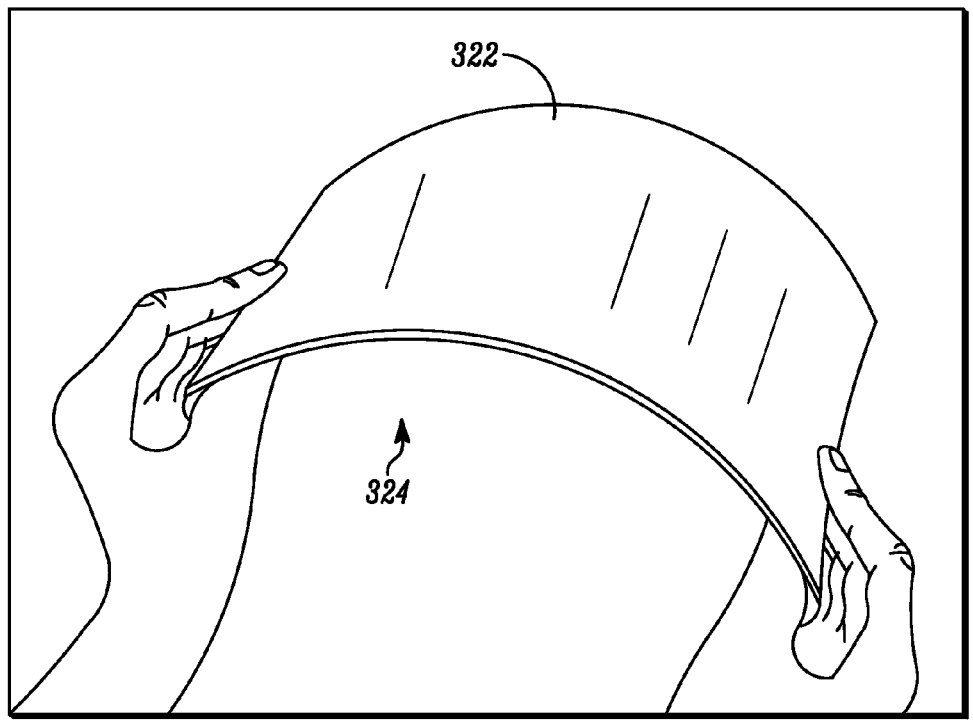
FIG. 15B is another exemplary mobile device having a flexible three dimensional curved lens having an abrasion resistant coating.

Exemplary mobile devices 302, 304 having a rigid three dimensional curved lens assembly 310 according to the present disclosure are illustrated in FIG. 14. Mobile device 302 includes a convex lens feature 306. Mobile device 304 includes a convex lens feature 306 and a concave lens feature 308. Convex 306 and concave 308 lens features as illustrated cannot be accomplished with a glass lens. By utilizing a lens assembly 310 including the siloxane layer and super hard coat layers on a plastic lens as described herein, acceptable scratch and mar abrasion result can be obtained.

Exemplary mobile devices 320, 324 having a flexible curved lens assembly 322 according to the present disclosure are illustrated in FIGS. 14A and 14B. Mobile device 320 is illustratively a mobile Smartphone, while mobile device 324 is illustrative a mobile e-reader having a larger form factor than mobile device 320. A flexible curved assembly 322 as illustrated cannot be accomplished with a glass lens. By utilizing a lens assembly 322 including the siloxane layer and super hard coat layers on a plastic lens as described herein, acceptable scratch and mar abrasion result can be obtained.

Figure 16:
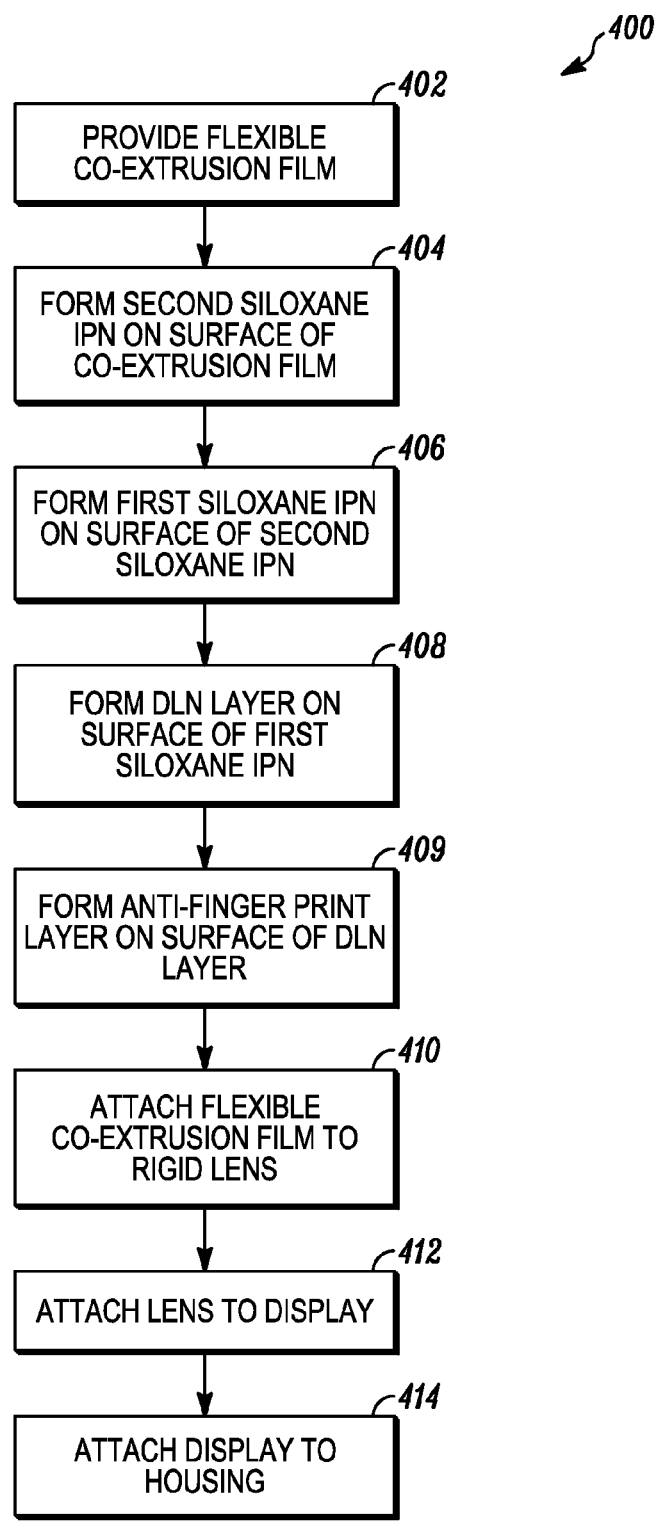
FIG. 16 is a flow chart of an exemplary process for making a device including an abrasion resistant lens coating.

An exemplary process 400 for making a device including an abrasion resistant lens coating is provided in FIG. 16. The process 400 may be useful in forming coated lens assembly 100 (FIG. 1) and coated lens assembly 140 (FIG. 4). In step 402, a flexible co-extrusion 108 film is provided as a substrate.

If a coated lens assembly 140 having two layers of siloxane IPN (FIG. 4) is being produced, then in step 404 a second siloxane IPN layer 106B is applied to the flexible co-extrusion 108 film substrate. In step 406, a first siloxane IPN layer 106A is then applied to the surface of the second siloxane IPN layer 106B.

If a coated lens assembly 100 having a single layer of siloxane IPN (FIG. 1) is being produced, then in step 404 a siloxane IPN layer 106 is applied to the flexible co-extrusion 108 film substrate, step 406 is not performed, and the process proceeds directly to step 408.

In step 408, a DLN layer 104 is applied to the top siloxane IPN layer 106 or 106A. In step 409, an anti-fingerprint layer 102 is applied to the surface of the DLN layer 104. In step 410, the flexible co-extrusion 108 is bonded to a surface of the rigid lens 110 through co-molding, thermo-forming, or adhesive bonding processes. The surface of the rigid lens 110 opposite the applied layers 114 is then bonded or assembled to a touch panel or display assembly 112.

Figure 17:
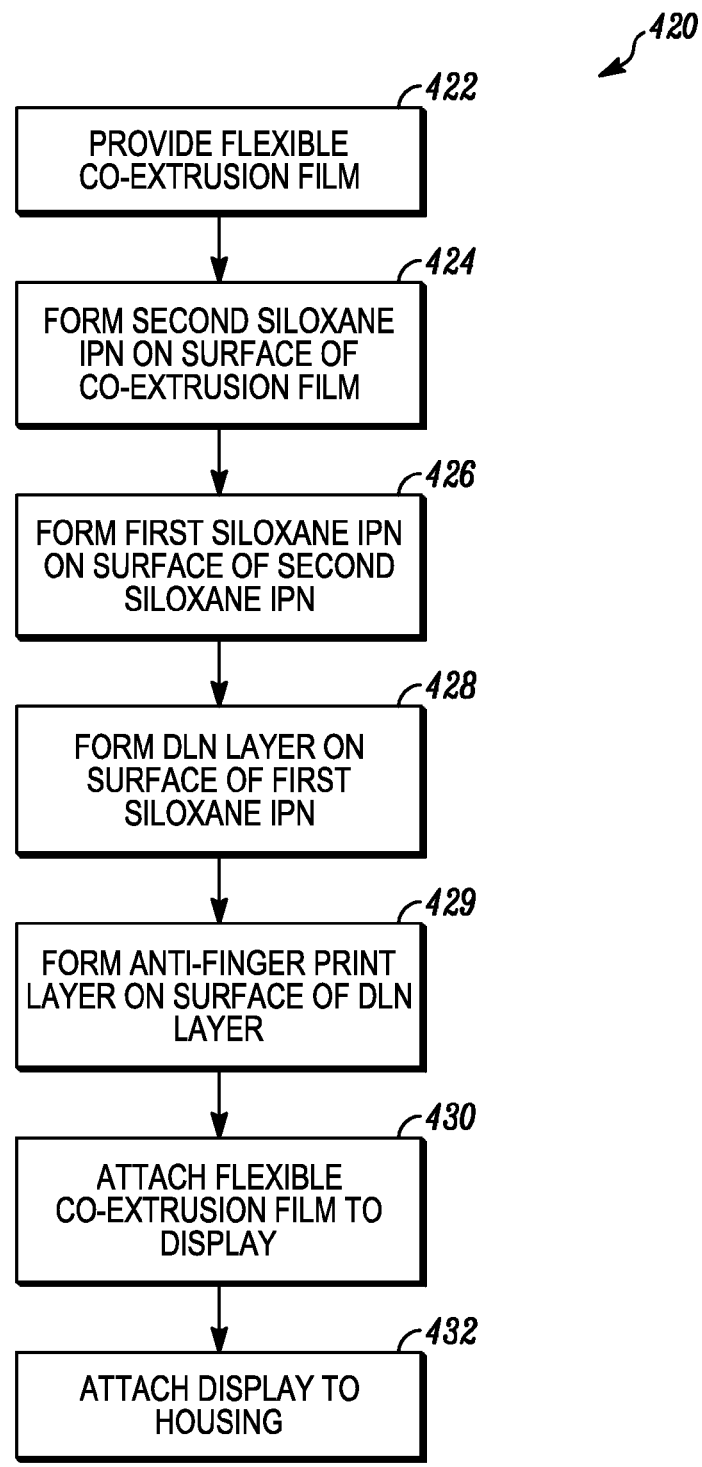
FIG. 17 is a flow chart of another exemplary process for making a device including an abrasion resistant lens coating.

Another exemplary process 420 for making a device including an abrasion resistant lens coating is provided in FIG. 17. The process 420 may be useful in forming coated lens assembly 120 (FIG. 2) and coated lens assembly 150 (FIG. 5). In step 422, a flexible co-extrusion 108 film is provided as a substrate.

If a coated lens assembly 140 having two layers of siloxane IPN (FIG. 5) is being produced, then in step 424 a second siloxane IPN layer 106B is applied to the flexible co-extrusion 108 film substrate. In step 426, a first siloxane IPN layer 106A is then applied to the surface of the second siloxane IPN layer 106B.

If a coated lens assembly 120 having a single layer of siloxane IPN (FIG. 2) is being produced, then in step 424 a siloxane IPN layer 106 is applied to the flexible co-extrusion 108 film substrate, step 426 is not performed, and the process proceeds directly to step 428.

In step 428, a DLN layer 104 is applied to the top siloxane IPN layer 106 or 106A. In step 429, an anti-fingerprint layer 102 is applied to the surface of the DLN layer 104. In step 430, the surface of flexible co-extrusion 108 opposite the applied layers 114 is bonded to a bonded or assembled to a touch panel or display assembly 112. Process 420 eliminates the need for a traditional rigid lens 110, allowing for use with a flexible or curved touch panel or display assembly 112.

Figure 18:
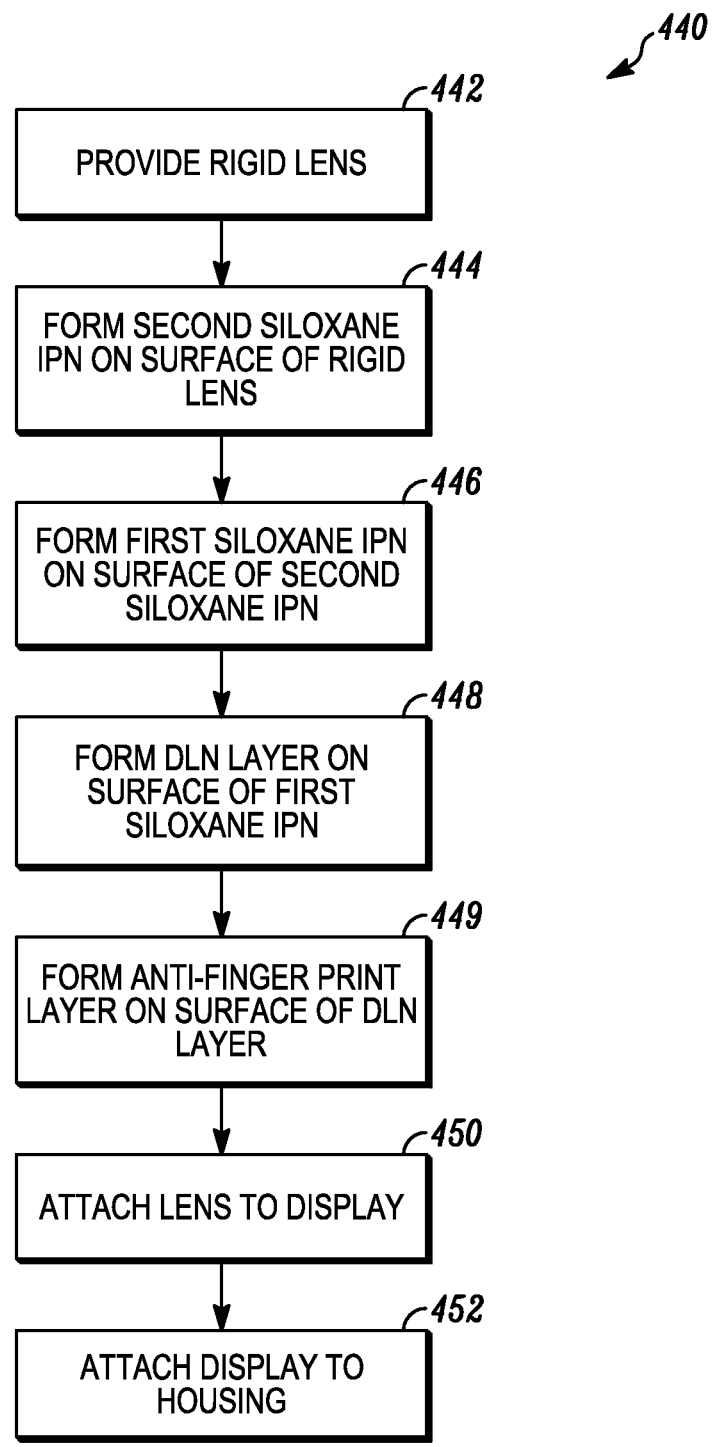
FIG. 18 is a flow chart of yet another exemplary process for making a device including an abrasion resistant lens coating.

Still another exemplary process 440 for making a device including an abrasion resistant lens coating is provided in FIG. 18. The process 440 may be useful in forming coated lens assembly 130 (FIG. 3) and coated lens assembly 160 (FIG. 6). In step 442, a rigid lens 110 is provided as a substrate.

If a coated lens assembly 160 having two layers of siloxane IPN (FIG. 6) is being produced, then in step 444 a second siloxane IPN layer 106B is applied to the rigid film 110 substrate. In step 446, a first siloxane IPN layer 106A is then applied to the surface of the second siloxane IPN layer 106B.

If a coated lens assembly 130 having a single layer of siloxane IPN (FIG. 3) is being produced, then in step 444 a siloxane IPN layer 106 is applied to the rigid lens 110 substrate, step 446 is not performed, and the process proceeds directly to step 448.

In step 448, a DLN layer 104 is applied to the top siloxane IPN layer 106 or 106A. In step 449, an anti-fingerprint layer 102 is applied to the surface of the DLN layer 104. In step 450, the surface of the rigid lens 110 opposite the applied layers 114 is then bonded or assembled to a touch panel or display assembly 112.

In summary, persons of ordinary skill in the art will readily appreciate that methods and apparatus for coating a lens for a display device have been provided. Among other advantages, the disclosed coatings provide for superior scratch and mar abrasion resistance compared to other plastic substrates. In addition, the disclosed coatings provide for comparable abrasion resistance to glass substrates while providing superior crack and fracture resistance.

The foregoing description has been presented for the purposes of illustration and description. It is not intended to be exhaustive or to limit the invention to the exemplary embodiments disclosed. Many modifications and variations are possible in light of the above teachings. It is intended that the scope of the invention be limited not by this detailed description of examples, but rather by the claims appended hereto.

What is claimed is:

1. A film comprising:
    a substrate;
    a siloxane layer comprising a siloxane-organic interpenetrating network contacting the substrate, the siloxane layer having a hardness greater than a hardness of the substrate;
    another siloxane layer comprising a siloxane-organic interpenetrating network contacting the siloxane layer, the another siloxane layer having a hardness greater than the hardness of the siloxane layer, the siloxane layer and the another siloxane layer having a combined thickness of at least 20 microns; and
    a diamond-like nano-composite layer comprising an amorphous carbon and a siloxane contacting the another siloxane layer, the diamond-like nano-composite layer having a hardness greater than the hardness of the another siloxane layer.

2. The film of claim 1, wherein the substrate is a plastic.

3. The film of claim 2, wherein the substrate is selected from the group consisting of poly(methyl methacrylate), polycarbonate, and co-extrusions of poly(methyl methacrylate) and polycarbonate.

4. The film of claim 1, wherein the substrate is flexible.

5. The film of claim 1, wherein the another siloxane layer has a thickness between 5 microns to 25 microns.

6. The film of claim 1, further comprising a hydrophobic treatment layer contacting the diamond-like nano-composite layer.

7. The film of claim 1, wherein the combined thickness is less than 75 microns.

8. The film of claim 1, wherein the amorphous carbon is an amorphous hydrogenated diamond-like carbon.

9. The film of claim 1, wherein the siloxane layer or the another siloxane layer comprise an interpenetrating network of a siloxane and an acrylic.

10. The film of claim 1, wherein the diamond-like nano-composite layer has a thickness between 3 microns and 20 microns.

11. A method of producing a film for a substrate comprising:
    providing the substrate;
    applying a siloxane layer comprising a siloxane-organic interpenetrating network contacting the substrate, the siloxane layer having a hardness greater than a hardness of the substrate;
    applying another siloxane layer comprising a siloxane-organic interpenetrating network contacting the siloxane layer, the another siloxane layer having a hardness greater than the hardness of the siloxane layer, the siloxane layer and the another siloxane layer having a combined thickness of at least 20 microns; and
    applying a diamond-like nano-composite layer comprising an amorphous carbon and a siloxane contacting the another siloxane layer, the diamond-like nano-composite layer having a hardness greater than the hardness of the another siloxane layer.

12. The method of claim 11, wherein the substrate is a co-extrusion of poly(methyl methacrylate) and polycarbonate.

13. The method of claim 11, wherein the substrate is a plastic lens.

14. The method of claim 11, wherein the substrate is affixed to a plastic lens.

15. The method of claim 11, wherein the substrate is affixed to a touch screen and display assembly.

16. The method of claim 11, wherein the siloxane layer and the another siloxane layer have a combined thickness of less than 75 microns.

17. The method of claim 11, wherein the diamond-like nano-composite layer is applied to the siloxane layer by a chemical vapor deposition process.

18. The method of claim 17, wherein the chemical vapor deposition process is selected from ion beam plasma enhanced chemical vapor deposition and plasma enhanced chemical vapor deposition.

19. The method of claim 11, wherein the siloxane layer comprises an interpenetrating network of a siloxane and an acrylic.

20. The method of claim 11, wherein the siloxane layer comprises from 25 wt.% to 50 wt.% siloxane.

* * * * *